United States Patent
Miyamoto et al.

(10) Patent No.: US 9,742,285 B2
(45) Date of Patent: Aug. 22, 2017

(54) SEMICONDUCTOR DEVICE AND AUTOMOBILE

(75) Inventors: Noboru Miyamoto, Tokyo (JP); Fumio Wada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 346 days.

(21) Appl. No.: 14/426,965

(22) PCT Filed: Sep. 13, 2012

(86) PCT No.: PCT/JP2012/073504
§ 371 (c)(1),
(2), (4) Date: Mar. 9, 2015

(87) PCT Pub. No.: WO2014/041666
PCT Pub. Date: Mar. 20, 2014

(65) Prior Publication Data
US 2015/0194895 A1    Jul. 9, 2015

(51) Int. Cl.
*H02M 1/08*      (2006.01)
*B60L 11/18*     (2006.01)
*H01L 29/78*     (2006.01)
*H03K 17/08*     (2006.01)
*H02M 3/335*     (2006.01)
(Continued)

(52) U.S. Cl.
CPC ............ *H02M 3/335* (2013.01); *B60L 11/18* (2013.01); *H01L 29/1602* (2013.01); *H01L 29/1608* (2013.01); *H01L 29/2003* (2013.01); *H01L 29/78* (2013.01); *H02M 1/08* (2013.01); *H03K 17/08* (2013.01)

(58) Field of Classification Search
CPC ......... H02M 3/335; H02M 1/08; B60L 11/18; H01L 29/1602; H01L 29/1608; H01L 29/2003; H01L 29/78; H03K 17/08

USPC .................................................. 307/9.1, 10.1
See application file for complete search history.

(56) References Cited

U.S. PATENT DOCUMENTS

| | | |
|---|---|---|
| 5,552,684 A | 9/1996 | Wada et al. |
| 2007/0216469 A1 | 9/2007 | Sakamoto |
| 2011/0204929 A1* | 8/2011 | Nakayama ............. H02M 1/08 327/109 |

FOREIGN PATENT DOCUMENTS

| | | |
|---|---|---|
| CN | 102187557 A | 9/2011 |
| EP | 2320544 A1 | 7/2009 |
| JP | H03-69936 U | 7/1991 |

(Continued)

OTHER PUBLICATIONS

Chinese Office Action from corresponding CN 201280075809.X, dated Jul. 19, 2016, with partial English translation, 9pp.

(Continued)

*Primary Examiner* — Hal Kaplan
(74) *Attorney, Agent, or Firm* — Studebaker & Brackett PC

(57) ABSTRACT

A semiconductor device of the present invention includes a transistor having a drain and a source, a voltage being applied between the drain and the source from a high-voltage power supply, a drive device that generates a source voltage and a gate voltage for the transistor from a voltage of a low-voltage power supply lower than that of the high-voltage power supply, and a voltage dividing circuit connected to the low-voltage power supply, wherein when the source voltage is lower than a certain value, an output voltage from the voltage dividing circuit is applied to the source.

14 Claims, 8 Drawing Sheets

(51) Int. Cl.
   *H01L 29/16*   (2006.01)
   *H01L 29/20*   (2006.01)

(56)                References Cited

FOREIGN PATENT DOCUMENTS

| JP | H07-251749 A | 10/1995 |
| JP | H08-051799 A | 2/1996 |
| JP | 2004-242475 A | 8/2004 |
| JP | 2006-314154 A | 11/2006 |
| JP | 2007-288992 A | 11/2007 |
| WO | 2010/021082 A1 | 2/2010 |

OTHER PUBLICATIONS

Notification of Transmittal of Translation of the International Preliminary Report on Patentability and Translation of Written Opinion of the International Searching Authority; PCT/JP2012/073504; issued on Mar. 26, 2015.
International Search Report; PCT/JP2012/073504; Dec. 25, 2012.
An Office Action; "Notification of Reason for Rejection," issued by the Japanese Patent Office on Jun. 23, 2015, which corresponds to Japanese Patent Application No. 2014-535309 and is related to U.S. Appl. No. 14/426,965; with English language partial translation.

\* cited by examiner

22:CONTROL POWER SUPPLY SYSTEM

FIG. 3

|  | SOURCE VOLTAGE a | GATE VOLTAGE b | CATHODE VOLTAGE ON ZENER DIODE c |
|---|---|---|---|
| DURING NORMAL OPERATION (ON) | 5V | 15V | 5V |
| DURING NORMAL OPERATION (OFF) | 5V | 0V | 5V |
| WHEN CONTROL VOLTAGE SYSTEM CANNOT GENERATE DESIRED VOLTAGE | 0V | 0V | 5V |
| WHEN ZENER DIODE IS ON | 3V | 0V | 5V |

SEMICONDUCTOR DEVICE AND AUTOMOBILE

TECHNICAL FIELD

The present invention relates to a semiconductor device used for high current switching or the like and to an automobile using the semiconductor device.

BACKGROUND ART

Patent Literature 1 discloses a transistor drive method. In this drive method, a voltage of a power supply called a gate-off power supply connected to a main power supply is applied to a gate when a control power supply for applying a voltage to the gate is shut down. The occurrence of transistor arm shorting or the like is thereby avoided when the control power supply is shut down. Transistors used therein are depletion-type (normally-on) transistors.

PRIOR ART

Patent Literature

Patent Literature 1: Japanese Patent Laid-Open No. 2004-242475

SUMMARY OF INVENTION

Technical Problem

There is a possibility of occurrence of some abnormality in a portion for supplying a voltage for control over the transistors and hence a failure to supply a predetermined voltage to the transistors. In such a case, the gate voltage and source voltage of each of the transistors are equal to or close to 0 V and the transistor is often turned on by the influence of noise or the like. This disadvantageously causes the waste of the electric charge of the power supply.

It is necessary to set the source voltage of the transistor higher than the gate voltage in order to avoid this problem. The method disclosed in Patent Literature 1 has problems that the apparatus is complicated and the loss increases because the gate-off power supply is produced by reducing the voltage of the main power supply which is as high as several hundred volts. Patent Literature 1 also has a problem that the gate-off power supply is unstable because a voltage surge or the like is superimposed on the voltage of the main power supply during operation.

The present invention has been achieved to solve the above-described problems, and an object of the present invention is to provide a semiconductor device capable of preventing a transistor from causing a short-circuit of a power supply when a portion for supplying a voltage for controlling the transistor does not function normally, and an automobile using the semiconductor device.

Means for Solving the Problems

A semiconductor device according to the present invention includes a transistor having a drain and a source, a voltage being applied between the drain and the source from a high-voltage power supply, a drive device that generates a source voltage and a gate voltage for the transistor from a voltage of a low-voltage power supply lower than that of the high-voltage power supply, and a voltage dividing circuit connected to the low-voltage power supply, wherein when the source voltage is lower than a certain value, an output voltage from the voltage dividing circuit is applied to the source.

Other features of the present invention will be made clear below.

Advantageous Effect of Invention

According to this invention, a phenomenon in which the transistor is turned on by the influence of noise to short the power supply when the portion for supplying a voltage to the transistor does not function normally can be prevented.

BRIEF DESCRIPTION OF THE DRAWINGS

FIG. 3 is a table showing the values of voltages of different portions of the semiconductor device according to Embodiment 1 of the present invention during operation.

DESCRIPTION OF EMBODIMENTS

Semiconductor devices according to embodiments of the present invention will be described with reference to the drawings. Identical or corresponding components are indicated by the same reference symbols and are not repeatedly described in some cases. Voltages in the embodiments of the present invention refer to potential differences from the ground unless specified otherwise.

Embodiment 1

Figure 1:
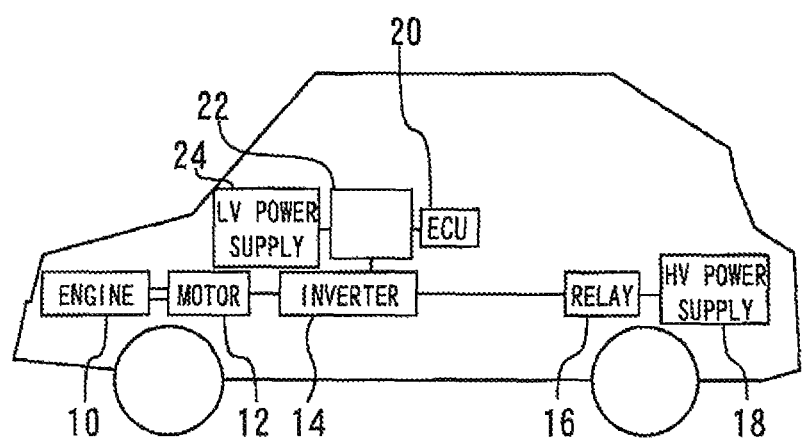
FIG. 1 is a schematic diagram showing an automobile according to Embodiment 1 of the present invention.

FIG. 1 is a schematic diagram showing an automobile according to Embodiment 1 of the present invention. This automobile is a hybrid vehicle having an engine 10 and a motor 12 and capable of traveling with a combination of the engine 10 and the motor 12. The motor 12 is connected to an inverter 14. A voltage is supplied to the inverter 14 from a high-voltage power supply 18 through a relay 16. The inverter 14 is controlled by an electronic control unit (ECU) 20 and a control power supply system 22. A voltage is supplied to the control power supply system 22 from a low-voltage power supply 24.

Figure 2:
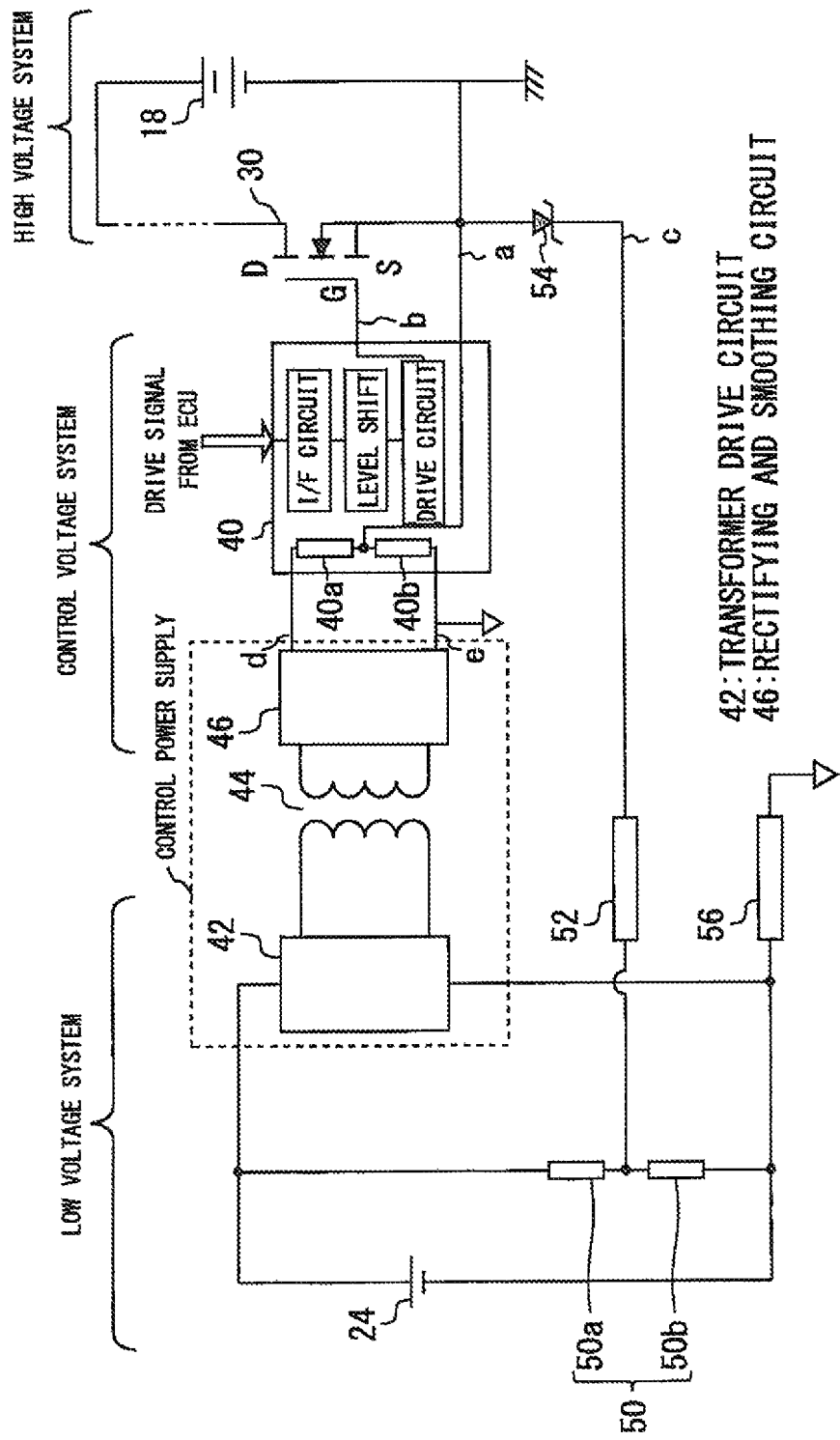
FIG. 2 is a circuit diagram showing a semiconductor device in the automobile shown in FIG. 1.

FIG. 2 is a circuit diagram showing a semiconductor device in the automobile shown in FIG. 1. A transistor 30 having a metal-oxide semiconductor (MOS) structure is a portion of elements constituting the above-described inverter. The transistor 30 is an enhancement-type field-effect transistor, which is a normally-off device. In the normally-off transistor, the supply of power is shut off between a drain and a source when a gate-source voltage (Vgs) is 0 V, and the power is supplied therebetween when the Vgs exceeds a threshold voltage (e.g., 0.6 V). A voltage is applied between the drain and the source of the transistor 30 from the high-voltage power supply 18. The transistor 30 supplies a current to the motor in response to this voltage applied to the transistor. The voltage of the high-voltage power supply 18 is, for example, in the range from 600 to 1200 V. A region to which the voltage is supplied from the high-voltage power supply 18 is referred to as a high-voltage system.

A drive device 40 is connected to the gate (point b) and the source (point a) of the transistor 30. The drive device 40 is a section in which a source voltage and a gate voltage for the transistor 30 are generated from a voltage of a control power supply generated by using the low-voltage power supply 24 having a voltage lower than that of the high-voltage power supply 18. The voltages of the drive device 40 are generated from the low-voltage power supply 24 by a transformer drive circuit 42, a transformer 44 and a rectifying and smoothing circuit 46 that constitute the control power supply. The voltage of the low-voltage power supply is, for example, 12V. The voltage applied to the drive device 40 from the control power supply is, for example, 15 V.

A voltage dividing circuit 50 is connected to the low-voltage power supply 24. The voltage dividing circuit 50 divides the voltage of the low-voltage power supply 24 to obtain a predetermined voltage. The voltage dividing circuit 50 has resistance elements 50a and 50b. A connection between the resistance elements 50a and 50b is an output of the voltage dividing circuit 50. The output of the voltage dividing circuit 50 is connected to one end of a resistance element 52. The resistance element 52 is formed for the purpose of electrically separating the low-voltage power supply 24 from the high-voltage power supply 18. Preferably, a resistance value of the resistance element 52 is, for example, equal to or higher than 2 MΩ.

A zener-diode 54 is connected to the other end of the resistance element 52. An anode of the zener-diode 54 is connected to the source of the transistor 30, whereas a cathode (point c) is connected to the output of the voltage dividing circuit 50 through the resistance element 52. A voltage at the point c is maintained at 5 V by the output of the voltage dividing circuit 50. The breakdown voltage of the zener-diode 54 is lower than the output voltage of the voltage dividing circuit 50 (the voltage at the point c). The breakdown voltage of the zener-diode 54 according to Embodiment 1 of the present invention is, for example, 2 V.

A side of the resistance element 50b opposite to a side connected to the resistance element 50a is connected to a ground through a resistance element 56. Thus, the ground of the voltage dividing circuit 50 is connected to the ground of the high-voltage system through the resistance element 56. Preferably, a resistance value of the resistance element 56 is, for example, equal to or higher than 2 MΩ. With the resistance element 56, the potential difference between the ground of a low-voltage system (representing a region to which the voltage is supplied from the low-voltage power supply 24) and the ground of the high-voltage power system can be set within a certain range while permitting a small deviation.

FIG. 3 is a table showing the values of voltages of different portions of the semiconductor device according to Embodiment 1 of the present invention during operation. When the transistor 30 is turned on under normal operating conditions, the drive device 40 sets the gate voltage higher than the source voltage. More specifically, the drive device 40 sets the source voltage to 5 V and sets the gate voltage to 15 V. When the transistor is turned off under the normal operating conditions, the drive device 40 sets the source voltage higher than the gate voltage. More specifically, the drive device 40 sets the source voltage to 5 V and sets the gate voltage to 0 V. That is, the Vgs (gate voltage–source voltage) under the normal operating conditions is set to 10 V when the transistor 30 is turned on, and is set to −5 V when the transistor 30 is turned off. The Vgs when the transistor 30 is turned on is set sufficiently higher than the threshold voltage of the transistor 30 so that an ON-state of the transistor 30 can be maintained even under the influence of noise. When the transistor 30 is turned off, the Vgs is set to a negative voltage value in order to enable the transistor 30 to be maintained in an OFF-state even under the influence of noise.

Thus, the drive device 40 applies to the gate of the transistor 30 the voltage corresponding to a drive signal from the ECU while applying the voltage of 5 V to the source. The transistor 30 thereby switches the high voltage applied from the high-voltage power supply 18.

A case where an abnormality occurs in the transformer drive circuit 42, the transformer 44 or the rectifying and smoothing circuit 46 of the control power supply or in the drive device 40 and a failure to supply the predetermined voltages to the gate and source of the transistor 30 occurs will be described. In this case, the control power supply (see FIG. 2) cannot generate the desired voltages, and the values of the gate voltage and the source voltage on the transistor 30 are equal to or close to 0 V. At this time, the Vgs is 0 V. When the gate voltage and the source voltage are equal to or close to 0 V, there is a possibility that the transistor 30 is turned on by the influence of noise to cause the waste of power of the high-voltage power supply 18 or that an overcurrent flows to damage the transistor 30.

In Embodiment 1 of the present invention, since the voltage on the cathode of the zener-diode 54 (point c) is 5 V, a reverse voltage equal to or higher than 2 V corresponding to the breakdown voltage of the zener-diode 54 is applied to the zener-diode 54 when the source voltage is reduced to a voltage equal to or lower than 3 V as a result of the occurrence of the abnormality. For example, when the source voltage is 0 V, a reverse voltage of 5 V is applied to the zener-diode 54, the zener-diode 54 breaks down and a voltage of 3 V is applied as the source voltage.

When the drive device 40 is unable to supply the predetermined voltages due to the abnormality in the control power supply or the drive device 40 as described above, the output voltage from the voltage dividing circuit 50 is applied to the source (point a) to make the source voltage higher than the gate voltage. That is, the Vgs is set to satisfy Vgs<0. Thus, when the portion for supplying the voltages to the transistor 30 does not operate normally, turning on of the transistor 30 by the influence of noise and hence shorting of the high-voltage power supply 18 can be prevented. The present invention is particularly effective in the case of using a transistor having a low threshold voltage (e.g., 0.6 V). Mounting the semiconductor device according to Embodiment 1 of the present invention in an automobile enables provision of an automobile having a fail-safe function to stably stop the system in the event of an abnormality in the control power supply system. The same can also be said with respect to semiconductor devices according to embodiments described below.

In the semiconductor device according to Embodiment 1 of the present invention, the output voltage from the voltage dividing circuit 50 is applied to the source by using the zener-diode 54 and, therefore, the above-described effect can be obtained with a markedly simple arrangement. Also, the voltage applied to the source in the event of an abnormality can be arbitrarily selected by changing the breakdown voltage of the zener-diode 54.

In the drive device 40, the gate voltage and the source voltage are generated separately. As shown in FIG. 2, the source voltage is generated by voltage dividing performed with resistance elements 40a and 40b on the voltage supplied from the rectifying and smoothing circuit 46. When both the voltages at points d and e shown in FIG. 2 are 0 V and when no voltage is supplied to the drive device 40, the drive device 40 outputs no voltages and each of the gate voltage and the source voltage is 0 V. The voltage applied from the voltage dividing circuit 50 to the source can be maintained because of the presence of the resistance elements 40a and 40b between the source (point a) and the points d and e.

According to the present invention, the output voltage from the voltage dividing circuit 50 connected to the low-voltage power supply 24 is applied to the source of the transistor 30 when the source voltage on the transistor 30 is lower than a certain value, thereby reliably turning off the transistor 30. Various modifications can be made within such a scope as not to depart from this feature. For example, the output voltage from the voltage dividing circuit 50 may be applied to the source by using a switch in place of the zener-diode 54.

While the enhancement-type transistor 30 is used, a depletion-type transistor or a junction FET, which is a device of a normally-on type, may alternatively be used. A normally-on device has a negative threshold voltage, is on between the source and the drain when the Vgs is 0 V, and is off when the Vgs is lower than the negative threshold value. In a case where a normally-on device is used, there is a high possibility of the transistor being turned on even without any influence of noise to cause wasting of the power from the high-voltage power supply 18 and occurrence of an excess current when the gate voltage and the source voltage on the transistor is equal to or close to 0 V as a result of occurrence of an abnormality in the control power supply or the drive device 40. In this embodiment, it is possible to prevent such a phenomenon. In a case where a normally-on device is used, the source voltage in the normal state and the cathode voltage on the zener-diode may be set higher than the voltage values shown in FIG. 3 (for example, to 10 V) to enable the transistor to be turned off with improved stability in the event of an abnormality. The transistor 30 is not limited to the MOS type. The transistor 30 may alternatively be a bipolar transistor. The transistor 30 may be formed of silicon but may preferably be formed of a wide-bandgap semiconductor having a bandgap larger than that of silicon. Examples of the wide-bandgap semiconductor are silicon carbide, a gallium nitride-based material and diamond. An insulated gate bipolar transistor (IGBT) may also be used as the transistor 30.

The position of the resistance element 52 is not limited to that indicated in FIG. 2. The resistance element 52 may be connected in series in the wiring connecting the output of the voltage dividing circuit 50, the zener-diode 54 and the source.

Embodiment 2

Figure 4:
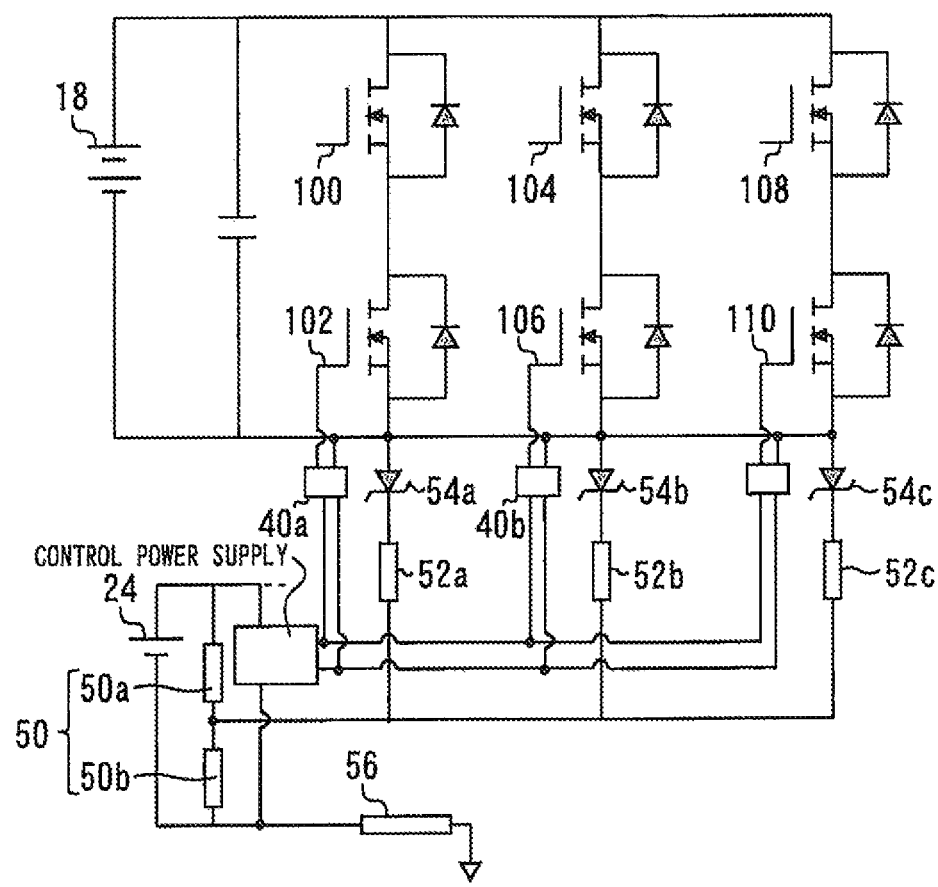
FIG. 4 is a circuit diagram of a semiconductor device according to Embodiment 2 of the present invention.

FIG. 4 is a circuit diagram of a semiconductor device according to Embodiment 2 of the present invention. The semiconductor device according to Embodiment 2 of the present invention is characterized by applying the output voltage from the voltage dividing circuit to the sources of transistors constituting lower arms of an inverter circuit.

A U-phase arm has a transistor 100 constituting an upper arm and a transistor 102 constituting a lower arm. A V-phase arm has a transistor 104 constituting an upper arm and a transistor 106 constituting a lower arm. A W-phase arm has a transistor 108 constituting an upper arm and a transistor 110 constituting a lower arm.

The anodes of zener-diodes 54a, 54b, and 54c are connected to the sources of the transistors 102, 106, and 110 constituting the lower arms. The output from the voltage dividing circuit 50 is connected to the cathodes of the zener-diodes 54a, 54b, and 54c through resistance elements 52a, 52b, and 52c. A drive device is connected to the gate and the source with respect to each of the transistors 102, 106, and 110, as is that in Embodiment 1. A control voltage generated by a control power supply from the low-voltage power supply 24 is applied to each drive circuit. With respect to the transistors 100, 104, and 108, a drive circuit (not shown) incorporating a voltage level shift circuit is connected to the gate and the source of each transistor.

The operation of each the transistors 100, 102, 104, 106, 108, and 110 under normal operating conditions is the same as that of the transistor in Embodiment 1. When the source voltage on the source of one of the transistors 102, 106, and 110 constituting the lower arms is reduced, the output voltage from the voltage dividing circuit 50 is applied through the zener-diode to the source at which the source voltage has been reduced.

Thus, the output voltage from the voltage dividing circuit 50 is applied to the transistors constituting the lower arms to maintain the lower arm transistors in the OFF-state with reliability, thus inhibiting arm shorting. While a three-phase alternating current inverter is illustrated in FIG. 4, this technique can be widely applied to inverters having upper and lower arms.

Embodiment 3

Figure 5:
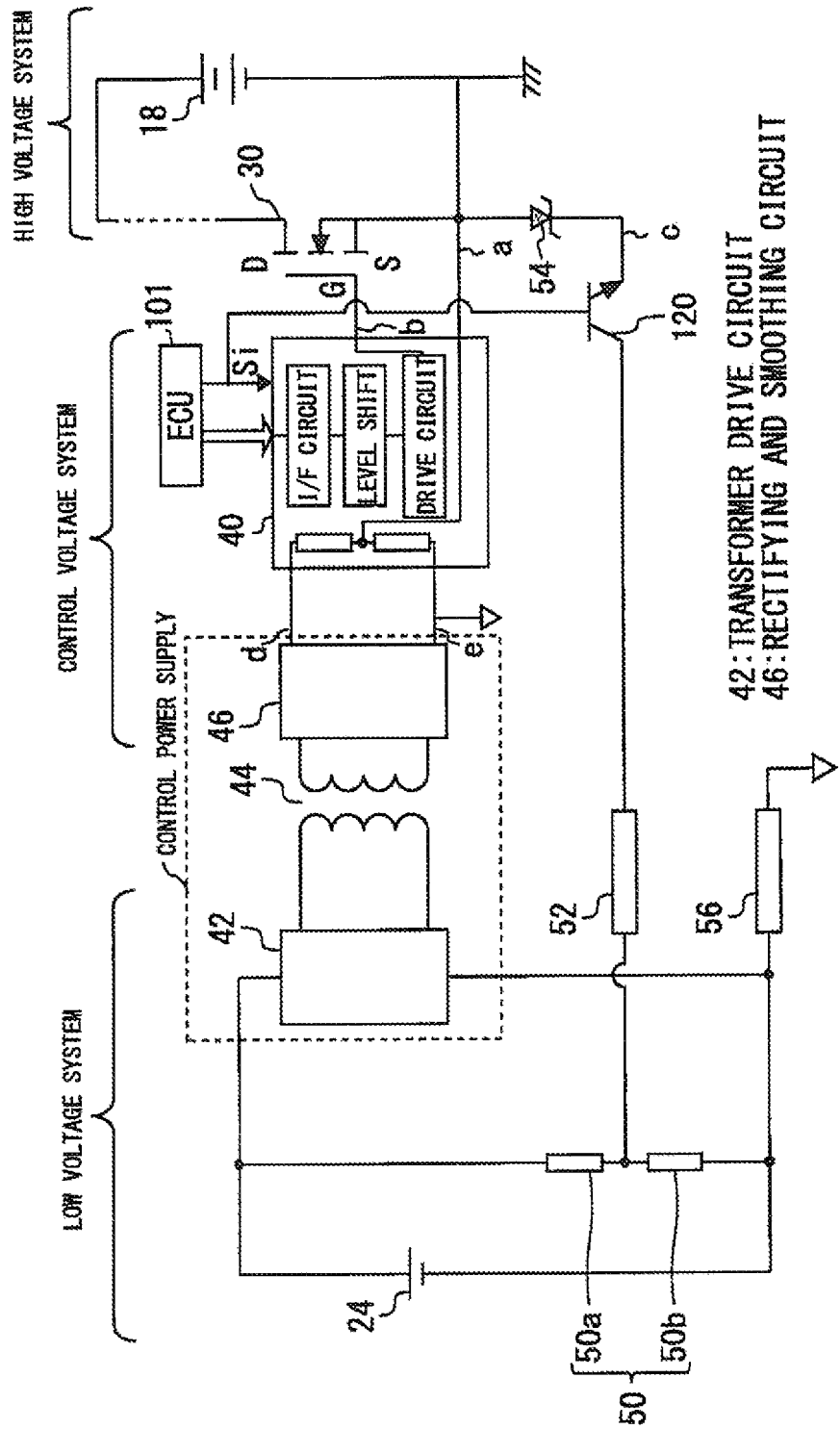
FIG. 5 is a circuit diagram of a semiconductor device according to Embodiment 3 of the present invention.

FIG. 5 is a circuit diagram of a semiconductor device according to Embodiment 3 of the present invention. The semiconductor device according to Embodiment 3 of the present invention is characterized by making selection between applying and not applying the output voltage from the voltage dividing circuit 50 to the cathode of the zener-diode 54 according to a signal output from an ECU to the drive device.

A switch 120 is connected between the cathode of the zener-diode 54 and the resistance element 52. The switch 120 electrically connects the output of the voltage dividing circuit 50 to the source of the transistor 30 through the resistance element 52 and the zener-diode 54 or electrically disconnects the output of the voltage dividing circuit 50 from the source of the transistor 30. Tuning on/off of the switch 120 is controlled with a shutoff signal Si output from an ECU 101. The shutoff signal Si is a signal issued to the drive device 40 by the ECU 101 when the ECU 101 determines that the transistor 30 should be shut off upon being notified from the drive device 40 that the difference between a temperature, a current or a voltage waveform in the drive device 40 and a target value has exceeded a certain value.

The switch 120 is turned on to electrically connect the output of the voltage dividing circuit 50 to the source when the shutoff signal Si provided as a signal for shutting off the transistor 30 is transmitted from the outside (ECU 101) to the drive device 40. In the other case, the switch 120 is turned off and electrically disconnects the output of the voltage dividing circuit 50 from the source.

In the semiconductor device according to Embodiment 3 of the present invention, a source voltage can be applied from the voltage dividing circuit 50 when the shutoff signal Si is issued, thus enabling prevention of shorting of the high-voltage power supply 18.

Embodiment 4

Figure 6:
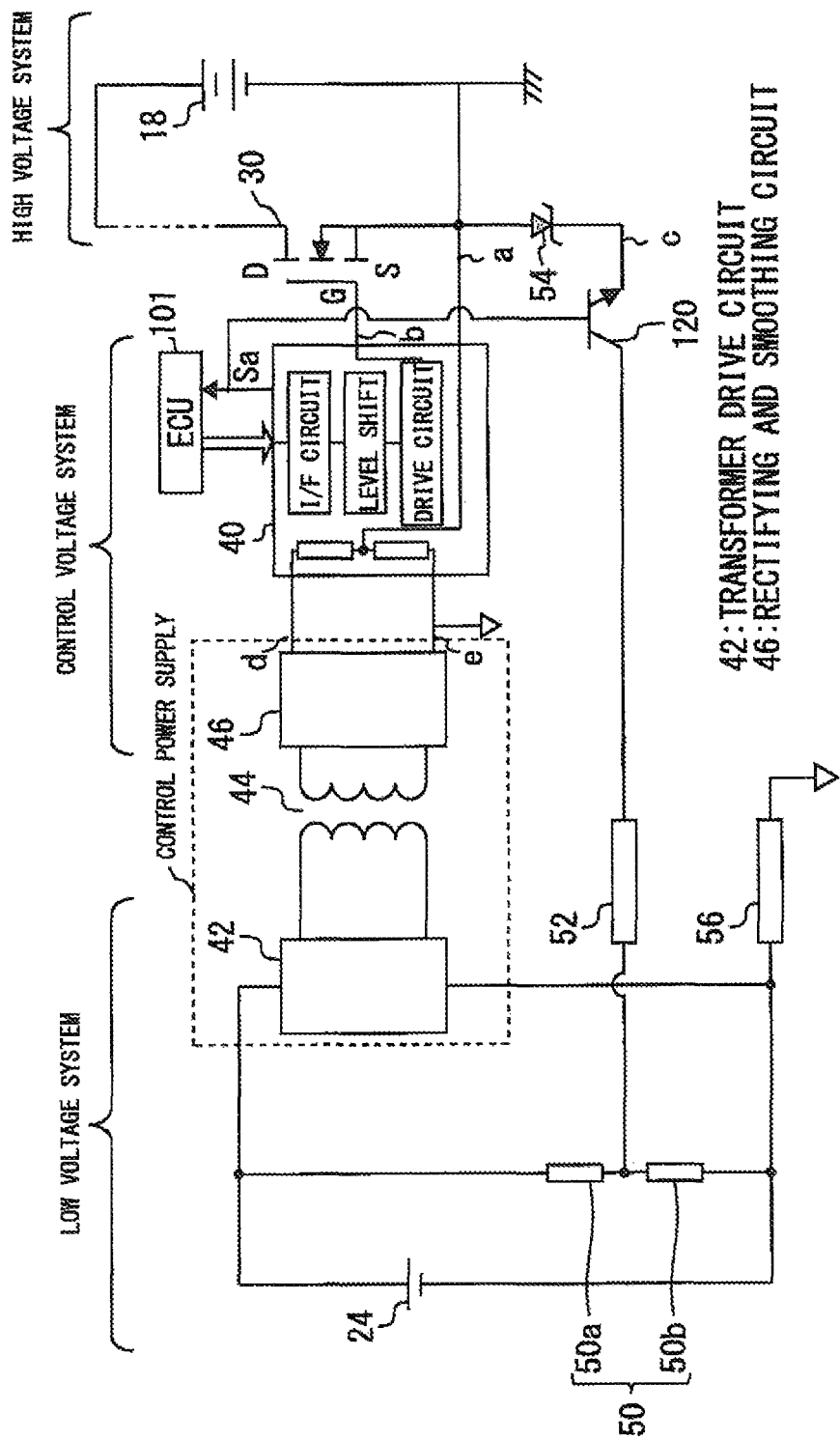
FIG. 6 is a circuit diagram of a semiconductor device according to Embodiment 4 of the present invention.

FIG. 6 is a circuit diagram of a semiconductor device according to Embodiment 4 of the present invention. The semiconductor device according to Embodiment 4 of the present invention is characterized by making selection between applying and not applying the output voltage from the voltage dividing circuit 50 to the cathode of the zener-diode 54 according to whether or not the drive device 40 outputs an abnormality signal indicating an abnormality to the outside.

Tuning on/off of the switch 120 is controlled with an abnormality signal Sa output from the drive device 40. The abnormality signal Sa is a signal issued to an ECU 101 by a protective circuit in the drive device 40 when the difference between a temperature, a current or a voltage waveform in the drive device 40 and a target value exceeds a certain value or when an abnormality in the transistor 30 is detected.

The switch 120 electrically connects the output of the voltage dividing circuit 50 to the source when the drive device 40 outputs the abnormality signal Sa indicating an abnormality to the outside (ECU 101) and electrically disconnects the output of the voltage dividing circuit 50 from the source in the other case.

In the semiconductor device according to Embodiment 4 of the present invention, a source voltage can be applied from the voltage dividing circuit 50 when the abnormality signal Sa is issued, thus enabling prevention of shorting of the high-voltage power supply 18.

Embodiment 5

Figure 7:
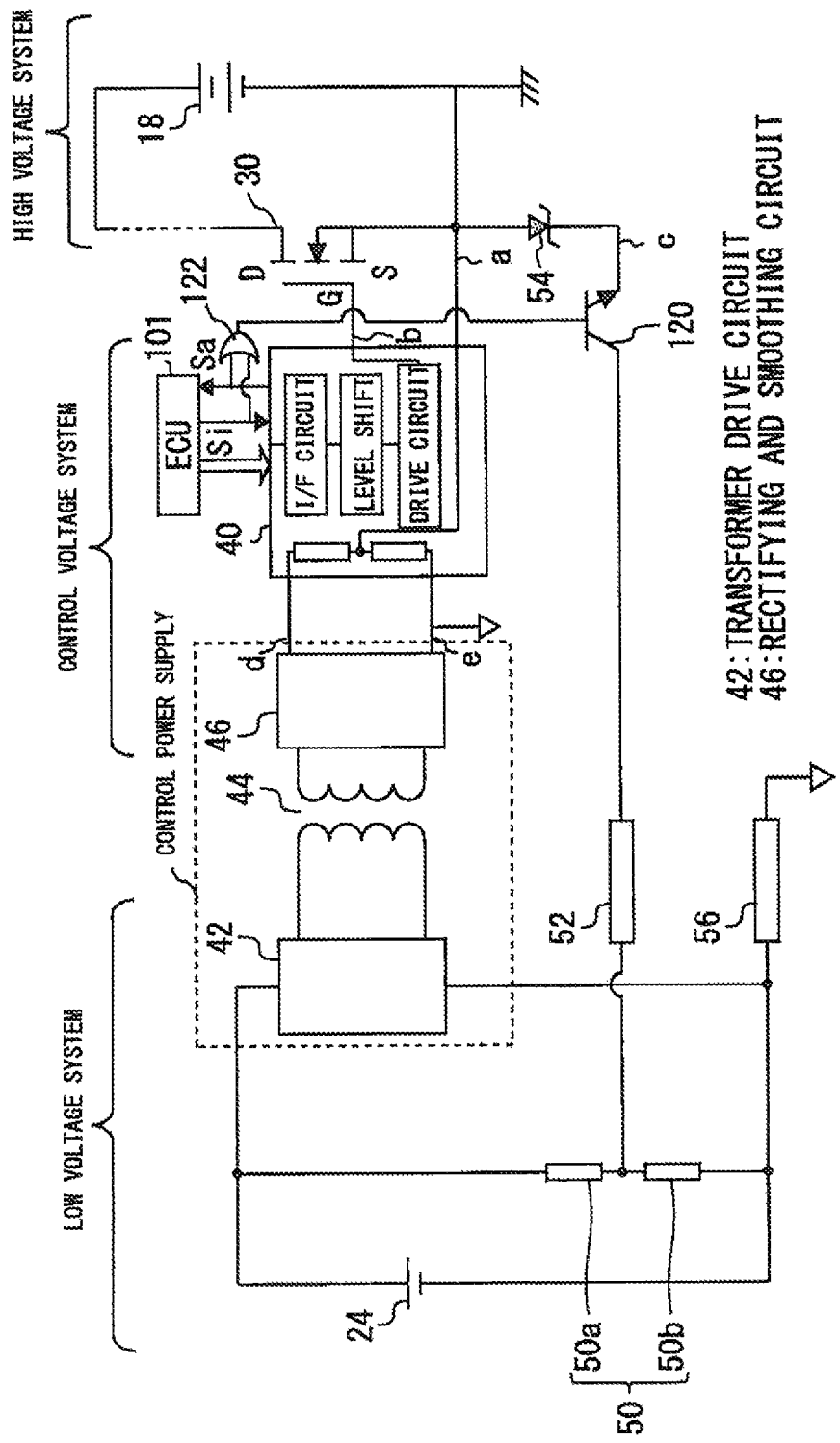
FIG. 7 is a circuit diagram of a semiconductor device according to Embodiment 5 of the present invention.

FIG. 7 is a circuit diagram of a semiconductor device according to Embodiment 5 of the present invention. In the semiconductor device according to Embodiment 5 of the present invention, the output of the voltage dividing circuit 50 is electrically connected to the source when the shutoff signal or the abnormality signal is being output, and the output of the voltage dividing circuit 50 is electrically disconnected from the source in the other case.

The semiconductor device according to Embodiment 5 of the present invention is provided with an OR circuit 122. The shutoff signal Si and the abnormality signal Sa are inputs to the OR circuit 122. With an output from the OR circuit 122, selection between turning on and turning off of the switch 120 is made.

In the semiconductor device according to Embodiment 5 of the present invention, a source voltage can be applied from the voltage dividing circuit 50 when the shutoff signal Si or the abnormality signal Sa is issued, thus enabling prevention of shorting of the high-voltage power supply 18.

Embodiment 6

Figure 8:
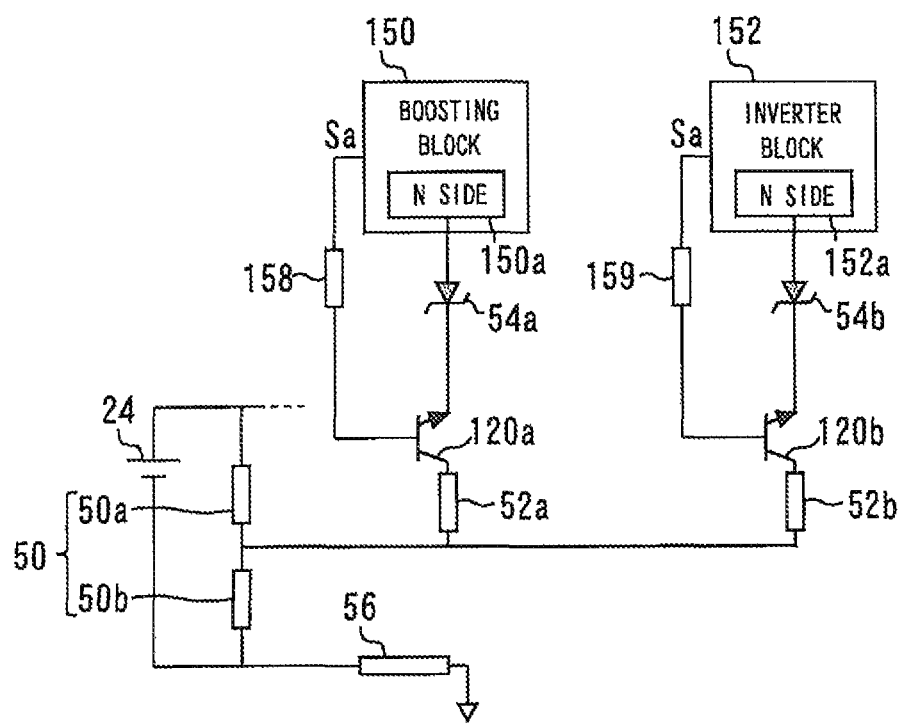
FIG. 8 is a circuit diagram of a semiconductor device according to Embodiment 6 of the present invention.

FIG. 8 is a circuit diagram of a semiconductor device according to Embodiment 6 of the present invention. The semiconductor device according to Embodiment 6 of the present invention is characterized by separately applying the output from the voltage dividing circuit 50 to each of the sources of transistors in a plurality of blocks.

The semiconductor device according to Embodiment 6 of the present invention is provided with a boosting block 150 and an inverter block 152. Transistors are respectively disposed in the boosting block 150 and the inverter block 152. That is, a first transistor 150*a* is formed in the boosting block 150, while a second transistor 152*a* is formed in the inverter block 152.

Each of the boosting block 150 and the inverter block 152 individually has a drive device. More specifically, a drive device contained in the boosting block 150 to generate a gate voltage and a source voltage for a first transistor 150*a* is referred to as a first drive device. A drive device contained in the inverter block 152 to generate a gate voltage and a source voltage for a second transistor 152*a* is referred to as a second drive device. Each of the first drive device and the second drive device is the same as the drive device in Embodiment 1.

A first switch 120*a* is connected to the cathode of a zener-diode 54*a*. The first switch 120*a* electrically connects the output of the voltage dividing circuit 50 to the source of the first transistor 150*a* or electrically disconnects the output of the voltage dividing circuit 50 from the source of the first transistor 150*a*. The gate of the first switch 120*a* is connected to the first drive device in the boosting block 150 through a resistance element 158. The first switch 120*a* electrically connects the output of the voltage dividing circuit 50 from the source of the first transistor 150*a* when the first drive device outputs a first abnormality signal Sa indicating an abnormality to the outside. The first switch 120*a* electrically disconnects the output of the voltage dividing circuit 50 from the source of the first transistor 150*a* when the first abnormality signal Sa is not output.

A second switch 120*b* is connected to the cathode of a zener-diode 54*b*. The second switch 120*b* electrically connects the output of the voltage dividing circuit 50 from the source of the second transistor 152*a* or electrically disconnects the output of the voltage dividing circuit 50 from the source of the second transistor 152*a*. The gate of the second switch 120*b* is connected to the second drive device in the inverter block 152 through a resistance element 159. The second switch 120*b* electrically connects the output of the voltage dividing circuit 50 to the source of the second transistor 152*a* when the second drive device outputs a second abnormality signal Sa indicating an abnormality to the outside. The second switch 120*b* electrically disconnects the output of the voltage dividing circuit 50 from the source of the second transistor 152*a* when the second abnormality signal is not output.

In the semiconductor device according to Embodiment 6 of the present invention, the output voltage of the voltage dividing circuit 50 can be applied to only to the source of the transistor in the block issuing the abnormality signal.

Embodiment 7

Figure 9:
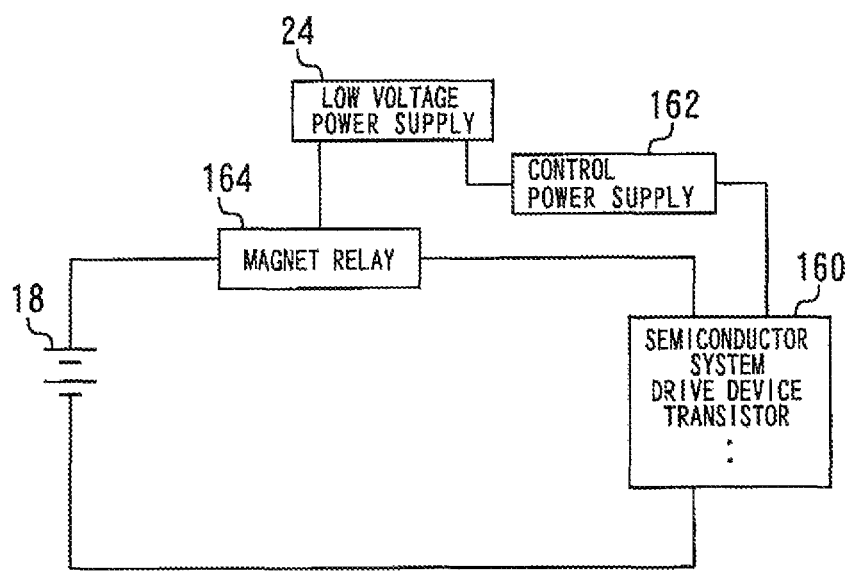
FIG. 9 is a circuit diagram of a semiconductor device according to Embodiment 7 of the present invention.

FIG. 9 is a circuit diagram of a semiconductor device according to Embodiment 7 of the present invention. The semiconductor device according to Embodiment 7 of the present invention is characterized by providing electrical separation between the high-voltage power supply 18 and a transistor when the voltage of the low-voltage power supply 24 is equal to or lower than a predetermined value.

The semiconductor device according to Embodiment 7 of the present invention is provided with a semiconductor system 160 incorporating a drive device and a transistor. The semiconductor system 160 is provided with the voltage of the low-voltage power supply 24 through a control power supply 162. The drive device generates a gate voltage and a source voltage for the transistor from the voltage of the low-voltage power supply 24. The voltage from the high voltage power supply 18 is applied to a drain and a source of the transistor.

A disconnecting part 164 is formed in the wiring electrically connecting the high-voltage power supply 18 and the transistor to each other. The disconnecting part 164 is formed by a magnet relay. The disconnecting part 164 is electrically connected to the low-voltage power supply 24. The disconnecting part 164 electrically separates the high-voltage power supply 18 and the transistor from each other when the voltage of the low-voltage power supply 24 is equal to or lower than a predetermined value. That is, the relay is opened. Thus, shorting of the high-voltage power supply 18 by the transistor when the voltage of the low-voltage power supply 24 is equal to or lower than the predetermined value can be inhibited.

The predetermined value designates, for example, a voltage at which a failure to maintain the transistor in the ON-state or the OFF-state occurs. In this case, when the voltage of the low-voltage power supply 24 is lower than the predetermined value, the voltage for maintaining the transistor in the ON-state or the OFF-state cannot be generated.

A suitable combination of the features of the semiconductor devices according to Embodiments 1 to 7 described above may be made. At least modifications corresponding to those in Embodiment 1 can be made in the invention according to any of Embodiments 2 to 7.

DESCRIPTION OF SYMBOLS

10 engine, 12 motor, 14 inverter, 16 relay, 18 high-voltage power supply, 20 ECU, 22 control power supply system, 24 low-voltage power supply, 30 transistor, 40 drive device, 40a,40b resistance elements, 42 transformer drive circuit, 44 transformer, 46 rectifying and smoothing circuit, 50 voltage dividing circuit, 50a,50b resistance element, 52 resistance element, 54 zener-diode, 56 resistance element, 120 switch, 122 OR circuit, 150 boosting block, 152 inverter block

The invention claimed is:

1. A semiconductor device comprising:
   a transistor having a drain and a source, a voltage being applied between the drain and the source from a high-voltage power supply;
   a drive device that generates a source voltage and a gate voltage for the transistor from a voltage of a low-voltage power supply lower than that of the high-voltage power supply; and
   a voltage dividing circuit connected to the low-voltage power supply,
   wherein when the source voltage is lower than a certain value, an output voltage from the voltage dividing circuit is applied to the source.

2. The semiconductor device according to claim 1, further comprising a zener-diode having an anode connected to the source and a cathode connected to an output of the voltage dividing circuit,
   wherein a breakdown voltage of the zener-diode is lower than the output voltage from the voltage dividing circuit.

3. The semiconductor device according to claim 2, further comprising a resistance element connected in series to wiring connecting the output of the voltage dividing circuit, the zener-diode, and the source.

4. The semiconductor device according to claim 3,
   wherein the voltage of the high-voltage power supply is in a range from 600 to 1200 V,
   wherein the voltage of the low-voltage power supply is 12 V, and
   wherein a resistance value of the resistance element is equal to or higher than 2 MΩ.

5. The semiconductor device according to claim 1, wherein the drive device sets the gate voltage higher than the source voltage when the transistor is turned on, and sets the source voltage higher than the gate voltage when the transistor is turned off.

6. The semiconductor device according to claim 1, wherein the transistor constitutes a lower arm of an inverter circuit.

7. The semiconductor device according to claim 1, further comprising a switch for electrically connecting or disconnecting the output of the voltage dividing circuit to or from the source,
   wherein the switch electrically connects the output of the voltage dividing circuit to the source when a shutoff signal provided as a signal for shutting off the transistor is transmitted from an outside to the drive device or when the drive device outputs an abnormality signal indicating an abnormality to the outside, and electrically disconnects the output of the voltage dividing circuit from the source in other cases.

8. The semiconductor device according to claim 1, further comprising:
   a boosting block; and
   an inverter block,
   wherein the transistor includes a first transistor formed in the boosting block; and a second transistor formed in the inverter block,
   wherein the drive device includes a first drive device that generates a gate voltage and a source voltage for the first transistor; and a second drive device that generates a gate voltage and a source voltage for the second transistor,
   wherein the semiconductor device further comprises:
   a first switch that electrically connects or disconnects the output of the voltage dividing circuit to or from the source of the first transistor; and
   a second switch that electrically connects or disconnects the output of the voltage dividing circuit to or from the source of the second transistor,
   wherein the first switch electrically connects the output of the voltage dividing circuit to the source of the first transistor when the first drive device outputs a first abnormality signal indicating an abnormality to the outside, and electrically disconnects the output of the voltage dividing circuit from the source of the first transistor when the first abnormality signal is not output, and
   wherein the second switch electrically connects the output of the voltage dividing circuit to the source of the second transistor when the second drive device outputs a second abnormality signal indicating an abnormality to the outside, and electrically disconnects the output of the voltage dividing circuit from the source of the second transistor when the second abnormality signal is not output.

9. The semiconductor device according to claim 1, wherein the transistor is of a normally-off transistor.

10. The semiconductor device according to claim 1, wherein the transistor is of a normally-on transistor.

11. The semiconductor device according to claim 1, wherein the transistor is formed out of a wide-bandgap semiconductor.

12. The semiconductor device according to claim 11, wherein the wide-bandgap semiconductor is silicon carbide, a gallium nitride-based material or diamond.

13. A semiconductor device comprising:
- a transistor having a drain and a source, a voltage being applied between the drain and the source from a high-voltage power supply;
- a drive device that generates a source voltage and a gate voltage for the transistor from a voltage of a low-voltage power supply lower than that of the high-voltage power supply; and
- a disconnecting part electrically connected to the low-voltage power supply, the disconnecting part electrically disconnecting the high-voltage power supply from the transistor when the voltage of the low-voltage power supply is lower than a voltage necessary for maintaining the transistor in an ON-state or an OFF-state.

14. An automobile comprising:
- a motor;
- a transistor having a drain and a source, a voltage being applied between the drain and the source from a high-voltage power supply;
- a drive device that generates a source voltage and a gate voltage for the transistor from an output voltage of a low-voltage power supply lower than that of the high-voltage power supply; and
- a voltage dividing circuit connected to the low-voltage power supply,
- wherein when the source voltage is lower than a certain value, an output voltage from the voltage dividing circuit is applied to the source.

* * * * *